United States Patent
Wong

(10) Patent No.: US 11,240,925 B1
(45) Date of Patent: Feb. 1, 2022

(54) SYSTEM AND METHOD FOR LONG CABLE MANAGEMENT AND PLUG PROTECTION SYSTEM

(71) Applicant: Dell Products L.P., Round Rock, TX (US)

(72) Inventor: Hin Loong Wong, Singapore (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/074,863

(22) Filed: Oct. 20, 2020

(51) Int. Cl.
    B65H 75/44 (2006.01)
    H05K 5/02 (2006.01)
    G06F 1/16 (2006.01)

(52) U.S. Cl.
    CPC ......... *H05K 5/0247* (2013.01); *G06F 1/1632* (2013.01)

(58) Field of Classification Search
    None
    See application file for complete search history.

(56) References Cited

U.S. PATENT DOCUMENTS

| | | | | |
|---|---|---|---|---|
| 5,450,509 A * | 9/1995 | Davis | ................... | G02B 6/3604 385/114 |
| 5,803,401 A * | 9/1998 | Matsuzoe | ............. | B65H 75/22 242/608.5 |
| 6,059,081 A * | 5/2000 | Patterson | ............... | H02G 11/02 191/12.2 A |
| 6,439,490 B1 * | 8/2002 | Hwang | ............. | B65H 75/4434 191/12.4 |
| 6,808,138 B2 * | 10/2004 | Liao | .................... | B65H 75/4423 242/378.1 |
| 7,116,883 B2 * | 10/2006 | Kline | ................... | G02B 6/4457 385/135 |
| 9,908,742 B2 * | 3/2018 | Mertesdorf | ............ | B65H 57/20 |
| 2006/0045458 A1 * | 3/2006 | Sasaki | .................... | G02B 6/444 385/135 |
| 2009/0084631 A1 * | 4/2009 | Casebolt | .................. | A62B 1/10 182/235 |
| 2013/0119178 A1 * | 5/2013 | Masuda | ............. | B65H 75/4428 242/378.1 |
| 2016/0012941 A1 * | 1/2016 | Ledwith | ............. | B65H 75/4449 174/70 R |
| 2018/0093852 A1 * | 4/2018 | Morey | ............... | B65H 75/4434 |
| 2018/0334353 A1 * | 11/2018 | Poutiainen | ......... | B65H 75/4463 |

* cited by examiner

*Primary Examiner* — Xanthia C Cunningham
(74) *Attorney, Agent, or Firm* — Baker Botts L.L.P.

(57) ABSTRACT

A cable management system for a cable in a dock capable of physical connection with an information handling system. The cable management system is configured such that rotation of a bottom cover in a first direction engages a gear and rotates a plurality of gears to extend the cable from the dock and rotation of the bottom cover in an opposite direction disengages one or more of the gears, wherein rotation of the bottom cover retracts the cable and friction forces apply tension to the cable to prevent the cable from tangling during retraction. A plug protection system covers the plug when the cable is retracted to protect the plug and uncovers the plug to allow extension of the cable for physically connection of the plug into a port in an information handling system.

20 Claims, 6 Drawing Sheets

SYSTEM AND METHOD FOR LONG CABLE MANAGEMENT AND PLUG PROTECTION SYSTEM

BACKGROUND

Field of the Disclosure

This disclosure relates generally to information handling systems and, more particularly, to docks and systems for managing extension and retraction of a long cable and protecting a cable plug in the dock.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments disclosed herein may be generally directed to a cable management system for winding long cables in a dock and a plug protection system for protecting a plug at the end of the cable.

A cable having a length greater than 0.25 meters may need multiple windings in a dock to avoid entanglement or binding of the cable. A cable management system comprises a bottom cover with a fixed gear, a rocker assembly having a rocker drive gear for engaging the fixed gear and a rocker sub gear engaged with the rocker drive gear, an idler gear for selectable engagement with the rocker sub gear, and a pair of cable gears coupled to the idler gear, each cable gear having a cable gear axle configured for rotational contact with a cable.

To extend the cable, rotation of the bottom cover in a first direction relative to a top cover rotates the rocker drive gear in a first direction around the fixed gear, causing rotation of the rocker drive gear about a rocker drive gear axis. Additional rotation of the bottom cover relative to the top cover rotates the rocker arm relative to the rocker drive gear axis to engage the idler gear. Rotation of the idler gear rotates the pair of cable gears, wherein contact between the cable gear axles and the cable enables the cable gear axles to apply an extension force to the cable to extend the cable out of the dock.

To retract the cable, rotation of the bottom cover in a second direction relative to the dock causes the rocker drive gear to rotate in a second direction around the fixed gear, causing rotation of the rocker drive gear about the rocker drive gear axis. However, the rotation causes the rocker arm to disengage the set of idler gears. The pair of cable gears maintain contact with the cable, wherein resistance by the cable gear axles applies a tension force to the cable. Maintaining tension on the cable during retraction reduces or eliminates cable management problems such as tangling, binding or bunching up of the cable.

Embodiments disclosed herein may be generally directed to systems for protecting a cable plug in a circular dock. A plug protection system comprises an outer cover, a bottom cover and a top cover. Rotation of the outer cover in a first direction relative to the top cover aligns an outer cover opening with a plug recess area in the bottom cover to uncover the cable plug, and rotation of the outer cover in a second direction positions the outer cover opening offset from the plug recess area offset to cover a plug positioned in the plug recess area. In some embodiments, a plug protection system includes one or more features to prevent further rotation of the outer cover relative to the top cover or the bottom cover.

Embodiments disclosed herein may be generally directed to a dock comprising systems for cable management and protecting a cable plug in a circular dock. A dock may have a top cover, a bottom cover and an outer cover. Rotation of the outer cover in a first direction may be independent of the bottom cover to align an outer cover opening with a plug recess area to uncover the plug. Additional rotation of the outer cover in the first direction when the outer cover is coupled with the bottom cover may rotate the bottom cover to extend the cable. Rotation of the outer cover in a second direction when the outer cover is coupled with the bottom cover may rotate the bottom cover to retract the cable and position the plug in the plug recess area. Additional rotation of the outer cover in the second direction may be independent of the bottom cover to position the outer cover opening offset from the plug recess area to cover the plug positioned in the plug recess area.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
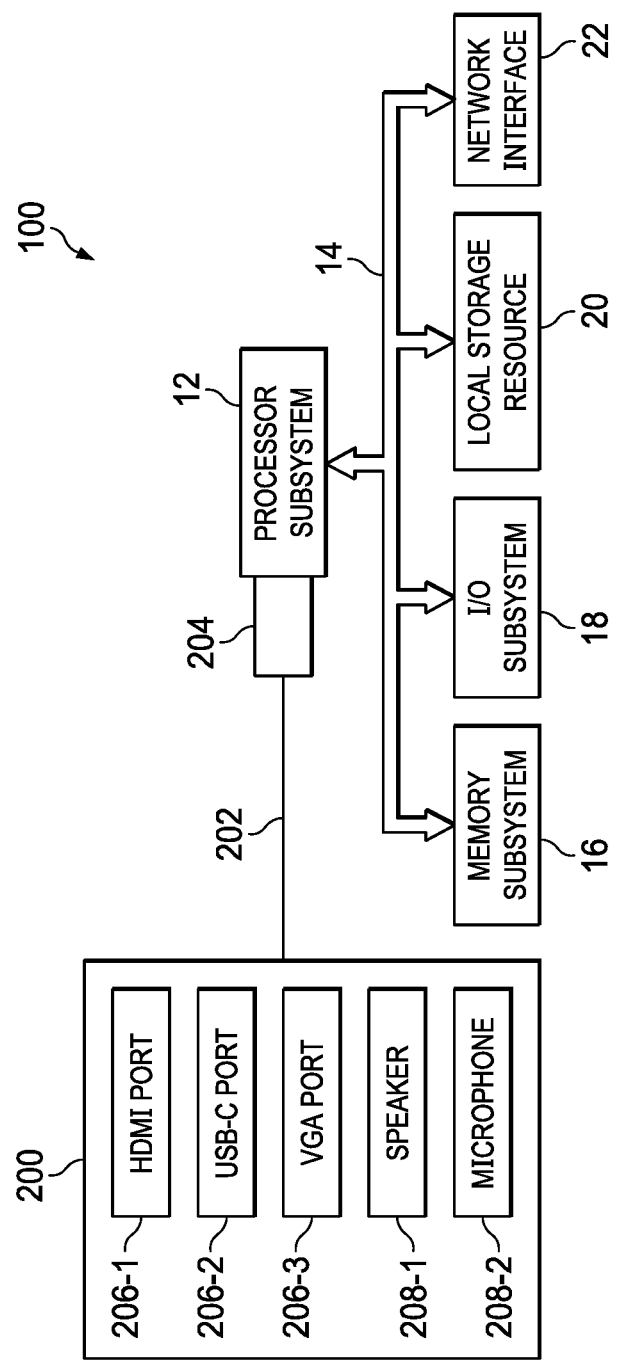
FIG. 1 is a block diagram of selected elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the unhyphenated form of the reference numeral refers to the collective or generic element. Thus, for example, port opening "216-1" refers to an instance of a port opening, which may be referred to collectively as port openings "216" and any one of which may be referred to generically as a port opening "216."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

As used herein, the term "dock" may refer to a peripheral device which may be physically connected to an information handling system via a cable stored in the dock, and which may have one or more ports to allow other devices to physically connect to the dock using other cables. A dock may include internal circuits and components such as a speaker, a microphone and ports for physically coupling other devices to the dock to provide additional functionality to an information handling system. A cable includes a plug for physically connecting the cable to the information handling system, such as by inserting the plug into an I/O port on the information handling system. Embodiments disclosed herein include a dock configured with a system for cable management of a cable and a system for protection of a plug at the end of the cable.

Embodiments disclosed herein are described with respect to circular docks with ports for additional functionality but may also be practiced with other components. Particular embodiments are best understood by reference to FIGS. 1-2, 3A-3B and 4A-4B wherein like numbers are used to indicate like and corresponding parts.

Turning to the drawings, FIG. 1 illustrates a block diagram depicting selected elements of an embodiment of information handling system 100. It is noted that FIG. 1 is not drawn to scale but is a schematic illustration.

As shown in FIG. 1, components of information handling system 100 may include, but are not limited to, a processor subsystem 12, which may comprise one or more processors, and a system bus 14 that communicatively couples various system components to processor subsystem 12 including, for example, a memory subsystem 16, an input/output (I/O) subsystem 18, local storage resource 20, and a network interface 22. Dock 200 may couple to information handling system 100 using cable 202 with plug 204 to provide additional functionality.

Processor subsystem 12 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 12 may interpret and execute program instructions and process data stored locally (e.g., in memory subsystem 16). In the same or alternative embodiments, processor subsystem 12 may interpret and execute program instructions and process data stored remotely (e.g., in a network storage resource).

System bus 14 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Memory subsystem 16 may comprise a system, device, or apparatus operable to retain and retrieve program instructions and data for a period of time (e.g., computer-readable media). Memory subsystem 16 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as information handling system 100, is powered down.

In information handling system 100, I/O subsystem 18 may comprise a system, device, or apparatus generally operable to receive and transmit data to or from or within information handling system 100. I/O subsystem 18 may represent, for example, a variety of communication interfaces, graphics interfaces, video interfaces, user input interfaces, and peripheral interfaces. In various embodiments, I/O subsystem 18 may be used to support various peripheral devices, such as a touch panel, a display adapter, a keyboard, a touch pad, or a camera, among other examples. In some implementations, I/O subsystem 18 may support so-called 'plug and play' connectivity to external devices, in which the external devices may be added or removed while information handling system 100 is operating.

Local storage resource 20 may comprise computer-readable media (e.g., hard disk drive, floppy disk drive, CD-ROM, and other type of rotating storage media, flash memory, EEPROM, or another type of solid-state storage media) and may be generally operable to store instructions and data.

Network interface 22 may be a suitable system, apparatus, or device operable to serve as an interface between information handling system 100 and a network (not shown). Network interface 22 may enable information handling system 100 to communicate over a network using a suitable transmission protocol or standard. In some embodiments, network interface 22 may be communicatively coupled via a network to a network storage resource (not shown). A network coupled to network interface 22 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 22 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to network interface 22 or various components associated therewith may be implemented using hardware, software, or any combination thereof.

A user may want to physically connect one or more external devices to information handling system 100 to extend the functionality of information handling system 100. For example, a user may want to physically connect information handling system 100 with an external monitor, a printer, a network, a mouse, and other devices but have a limited number of ports such that information handling system 100 cannot be coupled to all the devices at once, or information handling system 100 may not have a port needed to couple to a device. Embodiments of dock 200 described herein may physically connect to information handling system 100 via cable 202 with plug 204 and may include one or more ports 206 to allow physical connections with external devices (not shown) such that the external devices are connected to information handling system 100 through dock 200. External devices may physically connect to dock 200 using, for example, an HDMI cable connected to an HDMI port, a USB-C cable connected to USB-C port 206-2, and a VGA cable connected to VGA port 206-3 such that an external printer, monitor or other device may be connected to information handling system 100 through dock 200. Dock 200 may include other internal circuits and components 208 such as speaker 208-1 and microphone 208-2, for example. Embodiments of dock 200 may be coupled to information handling system 100 using cable 202. Cable 202 may have a cross-section dimension based on the type of cable 202. For example, cable 202 may have a cross-section dimension based on a USB-C type. Furthermore, embodiments of dock 200 described herein comprise a cable management system for use with cable 202 and a plug protection system for protecting plug 204 at the end of cable 202.

FIGS. 2, 3A-3B and 4A-4B depict views of embodiments of a dock for coupling external devices and components to information handling system 100. Upper portion 212 may be configured to contain components associated with providing functionality for information handling system 100. For example, embodiments of dock 200 may comprise ports 206 for connecting information handling system 100 to external devices and one or more of speaker 208-1 and microphone 208-2 in upper portion 212 to enable use of dock 200 for recording and transmitting audio information.

Cable Management System

Figure 2:
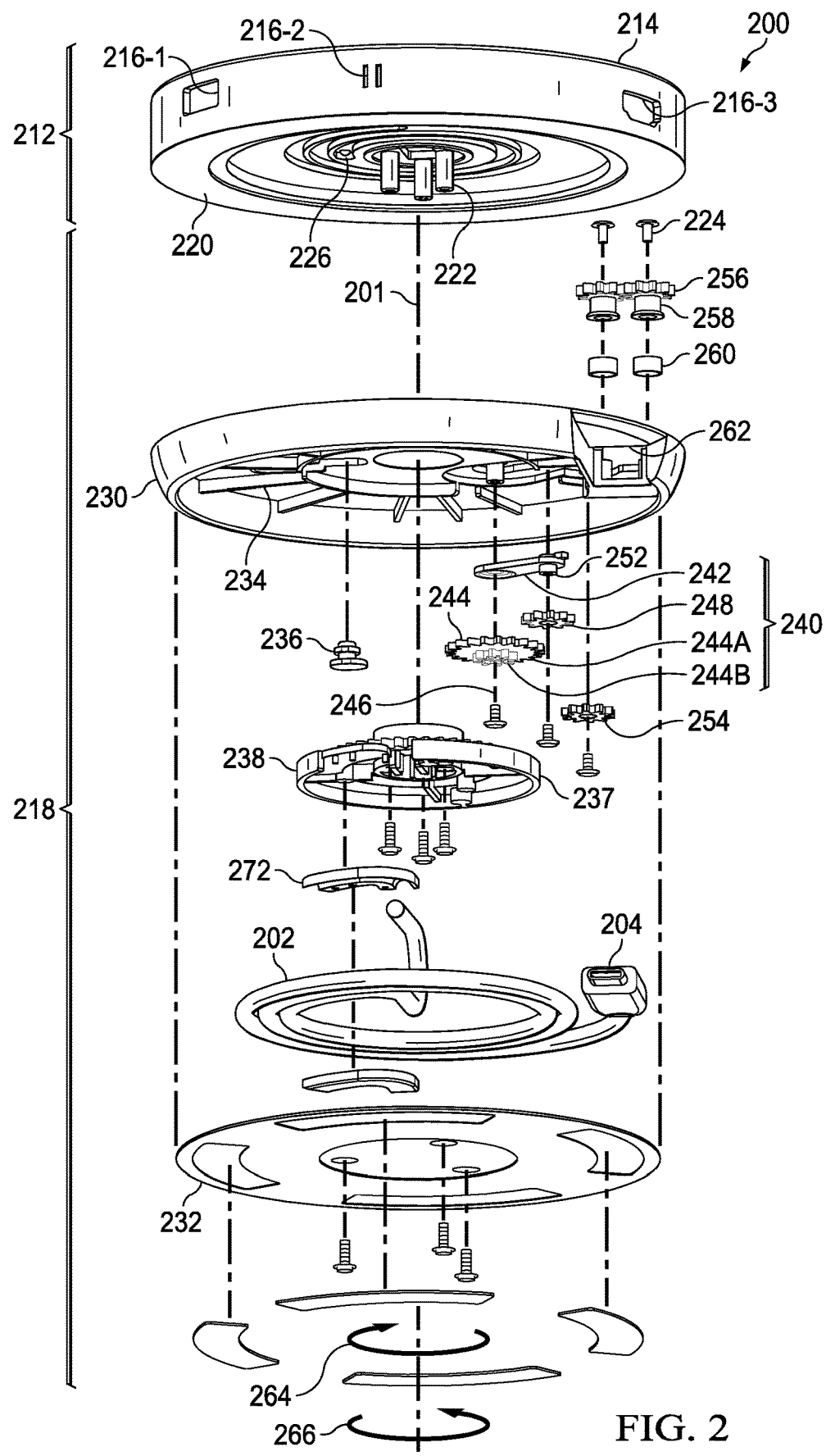
FIG. 2 is an exploded perspective view of one embodiment of a cable management system in a dock for use with the information handling system of FIG. 1.

Referring to FIG. 2, a system for extending and retracting cable 202 relative to dock 200 may be configured to apply an extension force to cable 202 to aid in extending cable 202 from dock 200 and apply a tension force to aid in retracting cable 202 into dock 200. Embodiments of dock 200 comprise upper portion 212 comprising top cover 214 configured for containing ports 206 and components 208 described above (not shown) and lower portion 218 rotatable relative to upper portion 212, wherein one or more of upper portion 212 and lower portion 218 are configured to house components of a cable management system.

Top cover 214 may be formed with a plurality of openings 216 for allowing additional devices to couple to information handling system 100 via dock 200. For example, opening 216-1 may be shaped to accommodate a USB-C port 206-2, opening 216-2 may be shaped to accommodate microphone 208-2 and opening 216-3 may be shaped to accommodate an HDMI port 206-1.

In some embodiments, bottom surface 220 of top cover 214 comprises a set of fixed gear posts 222 around central axis 201 and spiral groove 226 as part of a cable management system, discussed in greater detail below.

As depicted in FIG. 2, dock 200 comprises lower portion 218 comprising part of a cable management system for extending and retracting cable 202 relative to dock 200. In some embodiments, lower portion 218 comprises bottom cover 230 and spindle cover 232 configured to define a space for portions of a cable management system.

In some embodiments, bottom surface 220 of top cover 214 and bottom cover 230 are configured to define a space to allow multiple windings of cable 202. In some embodiments, cable 202 may have a length greater than 0.25 meters and bottom surface 220 of top cover 214 and bottom cover 230 may be configured to define a space for multiple windings of cable 202 having a length greater than 0.25 meters. In some embodiments, dock 200 may be configured to contain cable 202 having a length of approximately 0.5 meters.

A cable management system may comprise bottom cover 230 rotatable relative to top cover 214 about central axis 201. Fixed gear 238 may be coupled to top cover 214, wherein bottom cover 230 is rotatable relative to fixed gear 238 about central axis 201. Fixed gear 238 may have outer surface 237 configured to define a minimum radius of a winding of cable 202.

A cable management system may comprise rocker assembly 240 comprising rocker drive gear 244 rotatable about a rocker drive gear axis 246, rocker arm 242 rotatable about rocker drive gear axis 246, and rocker sub gear 248 engaged with rocker drive gear 244 and rotatable about rocker sub gear post 252 on rocker arm 242. In some embodiments, rocker drive gear 244 comprises rocker drive primary gear 244A and rocker drive secondary gear 244B, wherein rotation of rocker drive primary gear 244A rotates rocker drive secondary gear 244B or rotation of rocker drive secondary gear 244B rotates rocker drive primary gear 244A.

A cable management system may comprise idler gear 254 which may be selectively engaged or disengaged with rocker sub gear 248 and engaged with cable gears 256 comprising cable gear axles 258 that are rotatable about cable gear posts 224 coupled to bottom cover 230. Cable gears 256 may be located at a radial distance from central axis 201 and positioned on either side of cable opening 262. A distance between cable gears 256 may be based on a cross-section dimension of cable 202. For example, cable gears 256 may be separated by a distance based on cable 202 being a USB-C type cable. In some embodiments, each cable gear 256 comprises sleeve 260 for contact with cable 202. In some embodiments, cable 202 is compressed between cable gear axles 258 or sleeves 260.

In operation, rotation of bottom cover 230 relative to top cover 214 with rocker drive gear 244 engaged with fixed gear 238 causes rocker drive gear 244 to rotate rocker sub gear 248. Furthermore, rotation of bottom cover 230 relative to top cover 214 with rocker drive gear 244 engaged with fixed gear 238 causes rocker arm 242 to rotate about rocker drive gear axis 246.

Rotation of rocker arm 242 in a first direction may engage rocker sub gear 248 to idler gear 254 and rotation of rocker arm 242 in a second direction may disengage rocker sub gear 248 from idler gear 254.

Still referring to FIG. 2, idler gear 254 engages a first cable gear 256 of a pair of cable gears 256. Rotation of idler gear 254 engaged with either cable gear 256 causes rotation of both cable gears 256.

In some embodiments, bottom cover 230 comprises radial slot 234 and slider 236 extends through radial slot 234 and into spiral groove 226 in bottom surface of top cover 214, wherein rotation of bottom cover 230 relative to top cover 214 causes slider 236 to translate in radial slot 234 and translate in spiral groove 226. In some embodiments, contact between slider 236 and either end of spiral groove 226 prevents further rotation of bottom cover 230, which may prevent damage to cable 202 or plug 204. In some embodiments, contact between slider 236 and either end of radial slot 234 prevents further rotation of bottom cover 230, which may prevent damage to cable 202 or plug 204.

In some embodiments, bottom cover 230 comprises cable opening 262, wherein only plug 204 is accessible when cable 202 is fully retracted.

In some embodiments, a cable management system comprises cable strain relief 272 configured for receiving cable 202 such that cable 202 is biased to wind around fixed gear 238 and is protected from bending excessively. The cable strain relief 272 maintains cable 202 at a tangential direction relative to fixed gear 238 such that cable 238 does not bend outwards away from fixed gear 238.

Cable Extension

Figure 3A:
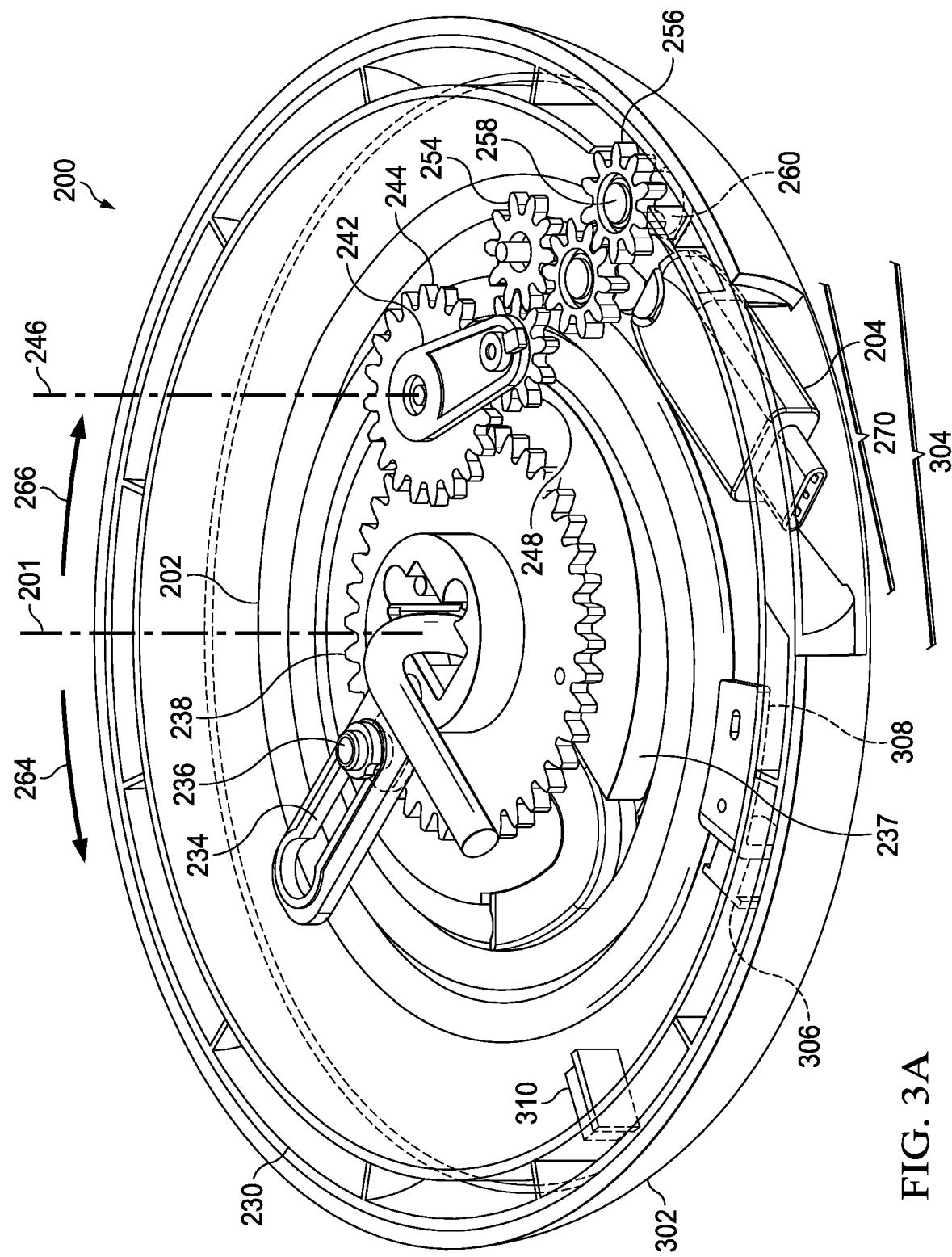
FIGS. 3A-3B and 4A-4B are cutaway and perspective views of one embodiment of a cable management system with a plug protection system.

Referring to FIGS. 2 and 3A, dock 200 may initially be in a configuration in which cable 202 is fully retracted in dock 200 with plug 204 in plug recess area 270 and a user wants to extend cable 202. Extension may be accomplished by the user rotating bottom cover 230 relative to top cover 214 (not shown in FIG. 3A) about central axis 201 in a first direction (indicated by arrow 264 and referred to hereinafter as extension direction 264).

In some embodiments, rotation of bottom cover 230 in extension direction 264 rotates rocker assembly 240 around central axis 201, which rotates rocker drive gear 244 about rocker drive gear axis 246 and rotates rocker arm 242 about rocker drive gear axis 246, which causes rocker sub gear 248 to engage idler gear 254. Continued rotation of bottom cover 230 in extension direction 264 with rocker sub gear 248 engaged with idler gear 254 rotates idler gear 254. Rotation of idler gear 254 engaged with first cable gear 256 rotates the pair of cable gears 256 and cable gear axles 258 fixed to cable gears 256.

Rotation of cable gears 256 in extension direction 264 rotates cable gear axles 258 in contact with cable 202 to apply an extension force on cable 202. In some embodiments, one or more of a gear ratio between fixed gear 238 and rocker drive gear 244, a gear ratio between rocker drive primary gear 244A and rocker drive secondary gear 244B, a gear ratio between rocker drive gear 244 and rocker sub gear 248, a gear ratio between rocker sub gear 248 and idler gear 254 and a gear ratio between idler gear 254 and cable gears 256 may be selected to rotate cable gear axles 258 at a desired speed relative to a speed at which bottom cover 230 is rotated. In some embodiments, a gear ratio may be selected such that, rotation of bottom cover 230 relative to top cover 214 causes cable gear axles 258 to apply an extension force to cable 202. In other words, rotation of cable gear axles 258 results in cable 202 extending from dock 200, wherein cable gear axles 258 may be rotated by rotation of bottom cover 230 relative to top cover 214. Rotation of cable gear axles 258 may apply an extension force to cable 202 to extend cable 202 from dock 200, which may reduce or prevent the possibility that cable 202 is able to tangle, bind or otherwise be prevented from fully extending from dock 200.

Cable Retraction

Figure 3B:
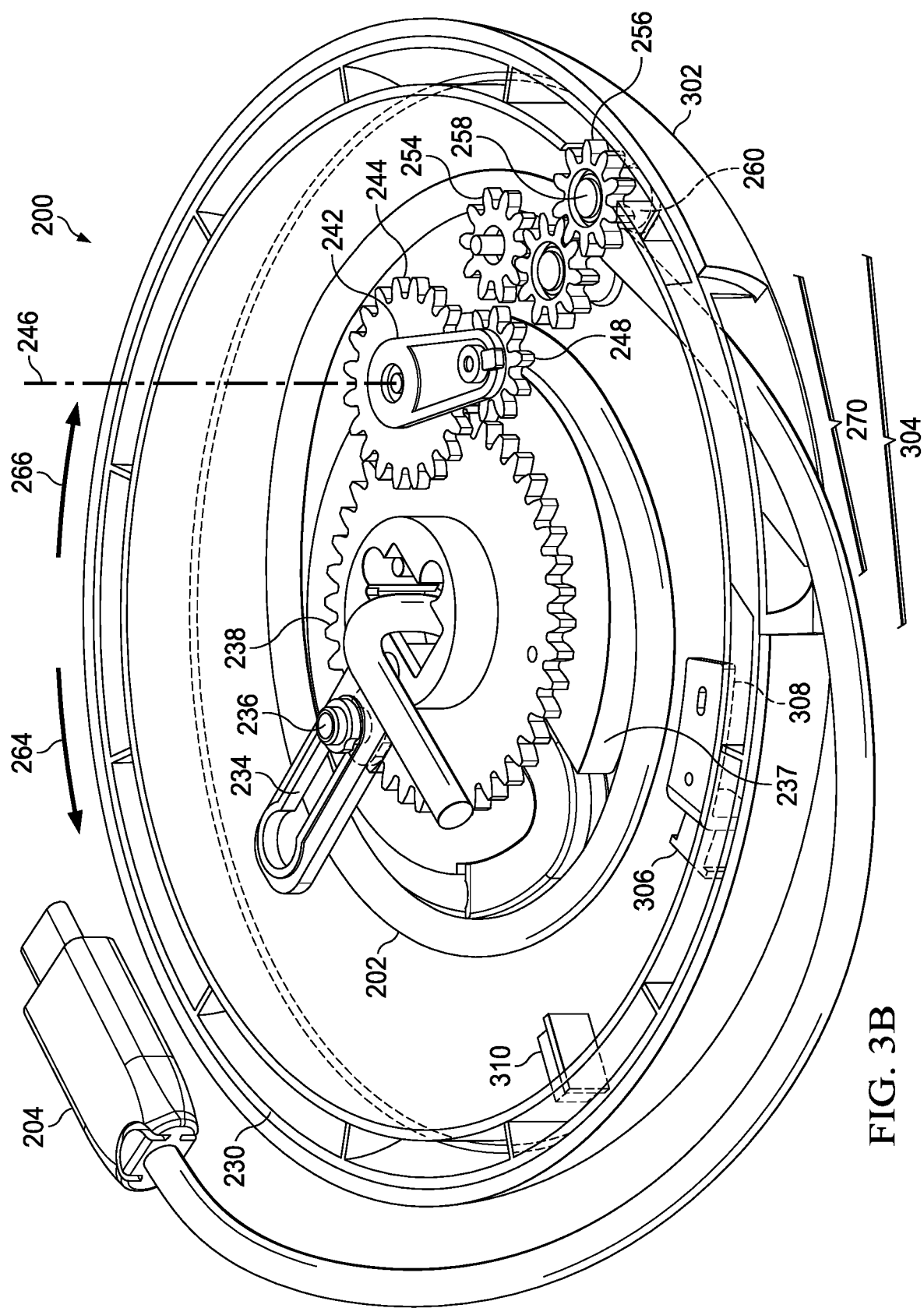

Referring to FIGS. 2 and 3B, dock 200 may initially be in a configuration in which cable 202 is extended from dock 200 and a user wants to retract cable 202 and position plug 204 in plug recess area 270. Retraction may be accomplished by the user rotating bottom cover 230 about central axis 201 in a second direction (indicated by arrow 266 and referred to hereinafter as retraction direction 266). If bottom cover 230 is rotated in retraction direction 266 relative to top cover 214 with rocker sub gear 248 engaged with idler gear 254, cable 202 could be retracted into dock 200 at a rate faster than desired. To prevent tangling and other possibilities of cable 202 binding in dock 200, a cable management system may be configured to disengage rocker sub gear 248 from idler gear 254 when bottom cover 230 is rotated in retraction direction 266 relative to top cover 214, wherein resistance provided by one or more of cable gears 256, cable gear axles 258 or sleeves 260 may apply a tension force to cable 202 to prevent tangling of cable 202 during retraction.

Referring to FIGS. 2 and 3B, when bottom cover 230 is rotated in retraction direction 266, rocker drive gear 244 engaged with fixed gear 238 causes rocker drive gear 244 to rotate about rocker drive gear axis 246 and causes rocker assembly 240 to rotate about central axis 201. Rotation of rocker drive gear 244 about rocker drive gear axis 246 while engaged with rocker sub gear 248 causes rotation of rocker sub gear 248. However, rotation of bottom cover 230 in retraction direction 266 rotates rocker arm 242 such that rocker sub gear 248 disengages from idler gear 254. With rocker sub gear 248 disengaged from idler gear 254, cable gears 256 and idler gear 254 may rotate independent of a rotation of rocker sub gear 248 such that retraction of cable 202 depends on rotation speed of bottom cover 230 relative to top cover 214. Furthermore, resistance between cable 202 and cable gear axles 258 may result in a tension force applied to cable 202, wherein cable 202 wound around fixed gear 238 under tension may be prevented from tangling or binding. In some embodiments, a material and dimensions of sleeves 260 may be selected to provide resistance such that a tension force is applied to cable 202 to slightly resist cable 202 retraction into dock 200. Applying a small tension force to cable 202 to resist retraction of cable 202 into dock 200 may reduce or prevent the possibility that cable 202 is able to tangle or bind or otherwise be prevented from fully retracting into dock 200.

Plug Protection

Referring to FIGS. 2, 3A-3B and 4A-4B, in some embodiments, a system for extending and retracting cable 202 relative to dock 200 may include a system for protecting plug 204 of cable 202. A plug protection system may be configured to cover plug 204 when plug 204 is positioned in plug recess area 270. A plug protection system may be configured such that rotating bottom cover 230 relative to top cover 214 covers or uncovers plug 204.

Referring to FIGS. 3A-3B and 4A-4B, dock 200 may be configured with a plug recess area 270, wherein plug 204 may be positioned in plug recess area 270 when cable 202 is fully retracted. In some embodiments, a plug protection system comprises outer cover 302 with outer cover opening 304 and tab 306 and bottom cover 230 comprises first limiter 308 and second limiter 310.

Two-Step Method to Uncover the Plug and Extend the Cable

A plug protection system may be integrated with embodiments of a cable management system, wherein one user action may uncover plug 204 and extend cable 202. In some embodiments, rotation of outer cover 302 in extension direction 264 may first uncover plug 204 and then extend cable 202 from dock 200.

Referring to FIGS. 2, 3A-3B and 4A-4B, outer cover 302 may be configured with outer cover opening 304 sized approximately equal to plug recess area 270. Dock 200 may be configured initially with plug 204 in plug recess area 270 and outer cover opening 304 positioned offset from plug recess area 270 to protect plug 204. Tab 306 may be in contact with second limiter 310.

Figure 4A:
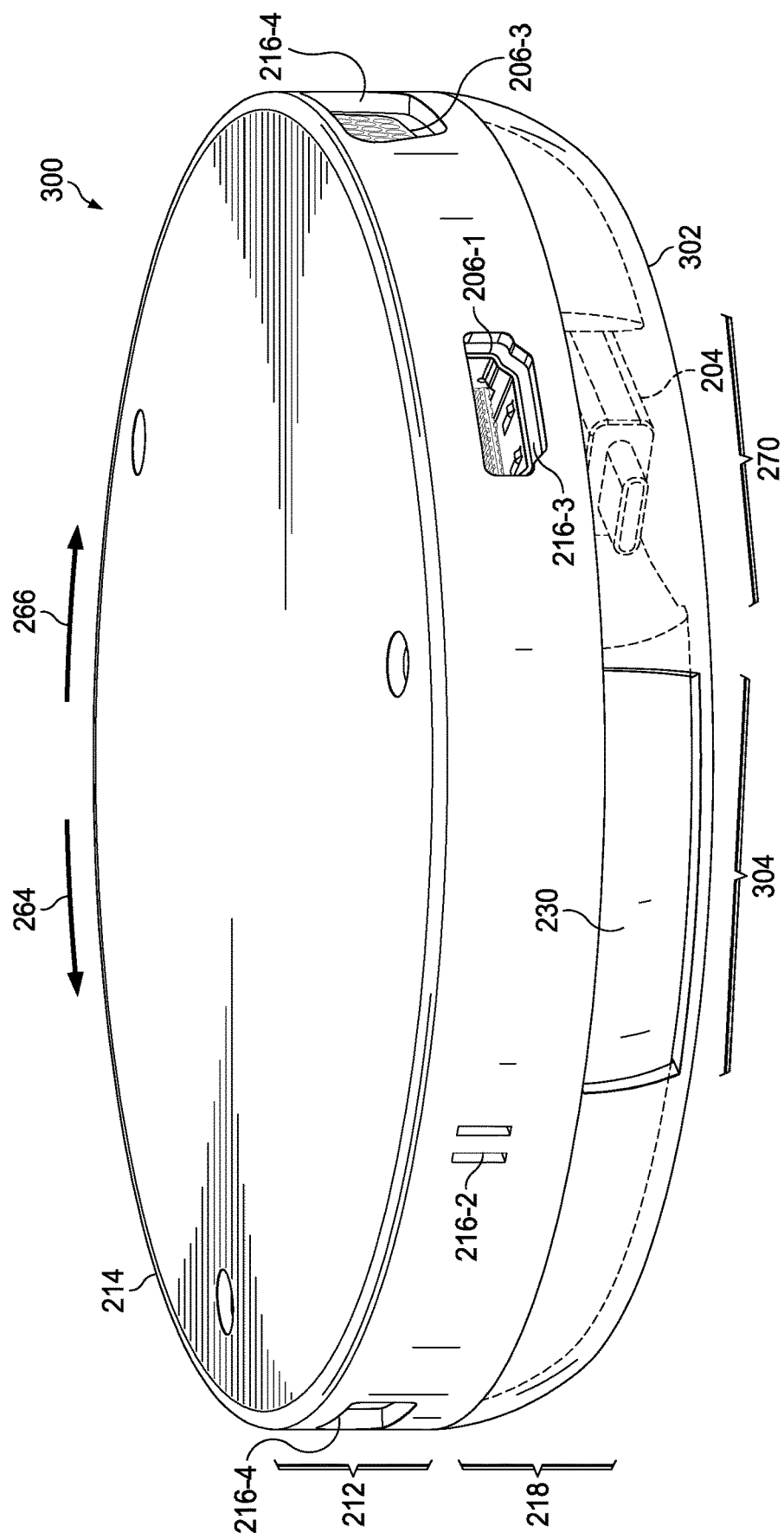
Figure 4B:
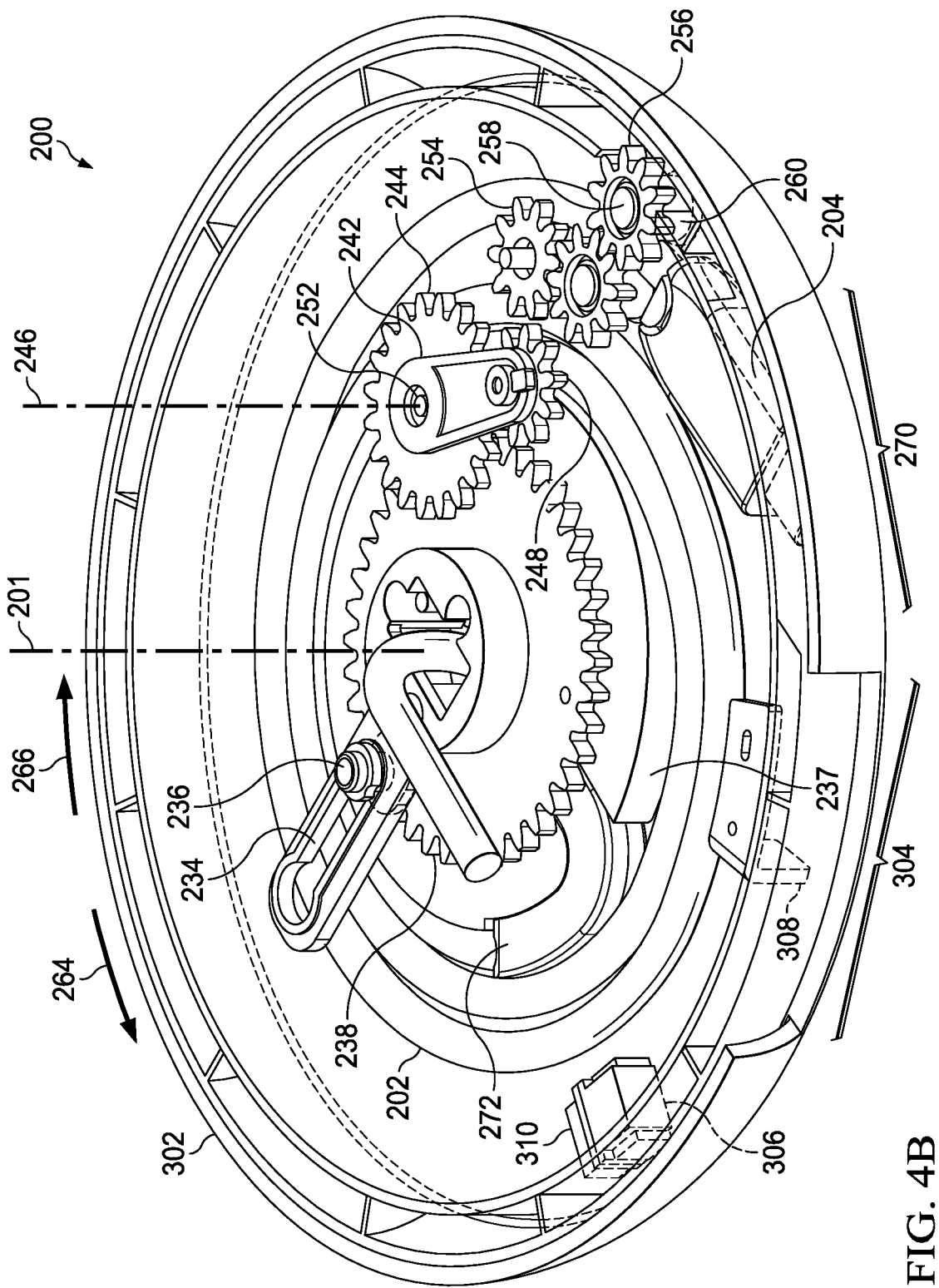

Referring to FIGS. 4A and 4B, dock 200 may be in a closed configuration with outer cover 302 rotated relative to bottom cover 230 such that outer cover opening 304 is positioned offset from plug recess area 270, wherein plug 204 is covered. Contact between tab 306 and second limiter 310 may prevent rotation of outer cover 302 in retraction direction 266 relative to bottom cover 230, wherein contact between slider 236 and an end of radial slot 234 or spiral groove 226 may prevent further rotation of bottom cover 230 relative to top cover 214.

Referring to FIG. 3A, outer cover 302 may be rotated in extension direction 264 independent of bottom cover 230 to position outer cover opening 304 in alignment with plug recess area 270 such that plug 204 is uncovered. Contact between tab 306 and first limiter 308 may prevent further rotation of outer cover 302 independent of bottom cover 230 in extension direction 264. Instead, further rotation of outer cover 302 in extension direction 264 with tab 306 in contact with first limiter 308 causes bottom cover 230 to rotate in extension direction 264 to extend cable 202 from dock 200. Rotation of outer cover 302 and bottom cover 230 may continue until contact between slider 236 and an end of radial slot 234 or spiral groove 226 prevents further rotation of bottom cover 230 relative to top cover 214.

Two-Step Method to Retract the Cable and Cover the Plug

Referring to FIG. 3B, dock 200 may be in a configuration in which outer cover 302 is positioned with outer cover opening 304 aligned with plug recess area 270 and cable 202 is extended. In some embodiments, one or more of tab 306 and first limiter 308 comprises a magnet, wherein a magnetic (attraction) force between tab 306 and first limiter 308 causes bottom cover 230 to rotate with outer cover 302. In this configuration, rotation of outer cover 302 in retraction direction 266 with tab 306 in contact with first limiter 308 causes bottom cover 230 to rotate relative to top cover 214 to retract cable 202 into dock 200 as described above and position plug 204 in plug recess area 270, wherein plug 204 is accessible. Rotation of outer cover 302 and bottom cover 230 as a single unit may continue until contact between slider 236 and an end of radial slot 234 or spiral groove 226 prevents further rotation of bottom cover 230 relative to top cover 214. In some embodiments, one or more of a first end of spiral groove 226 and a second end of spiral groove 226 comprises a detent or bump feature (not shown) that provides a tactile feedback that the slider 236 has reached the first end or the second end of spiral groove 226.

In some embodiments, one of tab 306 and first limiter 308 may be magnetic, wherein contact between tab 306 and first limiter 308 includes a magnetic attraction force such that separating tab 306 from first limiter 308 requires overcoming the magnetic force. In some embodiments, one of tab 306 and first limiter 308 is configured with a spring, snap, detent or other mechanical feature, wherein contact between tab 306 and first limiter 308 includes a mechanical resistance force such that separating tab 306 from first limiter 308 requires overcoming the mechanical resistance force.

Referring to FIGS. 3A, 3B and 4A, continued rotation of outer cover 302 in retraction direction 266 may overcome a magnetic or mechanical force between tab 306 and first limiter 308, wherein continued rotation of outer cover 302 in retraction direction 266 rotates outer cover 302 independently of bottom cover 230 to position outer cover opening 304 offset from plug recess area 270. In this configuration, tab 306 on outer cover 302 may contact second limiter 310 to prevent further rotation of outer cover 302 relative to bottom cover 230 and slider 236 may contact an end of radial slot 234 or spiral groove 226 to prevent further rotation of bottom cover 230 relative to top cover 214.

Advantageously, a user is able to perform one action (i.e., rotation of outer cover 302) to uncover plug 204 and extend cable 202 or to retract cable 202 and cover plug 204, wherein embodiments disclosed herein ensure cable 202 remains free of tangling inside dock 200 during extension and retraction, and embodiments protect plug 204.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A cable management system for extending and retracting a cable from a dock, the cable management system comprising:
    a fixed gear coupled to a top cover, the fixed gear defining a central axis;
    a bottom cover coupled to the top cover and rotatable about the central axis, the bottom cover comprising:
        a rocker assembly rotatably coupled to the bottom cover and offset from the central axis, the rocker assembly comprising:
            a rocker drive gear engaged with the fixed gear, the rocker drive gear defining a rocker drive gear axis;
            a rocker sub gear engaged with the rocker drive gear; and
            a rocker arm coupled to the rocker drive gear and the rocker sub gear and rotatable about the rocker drive gear axis, wherein rotation of the bottom cover rotates the rocker drive gear and the rocker arm relative to the rocker drive gear axis;
        an idler gear; and
        a pair of cable gears, wherein a first cable gear of the pair of cable gears is engaged with the idler gear, wherein each cable gear is coupled to a cable gear axle in contact with the cable, wherein:
            rotation of the bottom cover in an extension direction rotates the rocker arm to engage the rocker sub gear with the idler gear, wherein rotation of the pair of cable gears causes a first cable gear axle and a second cable gear axle to apply an extension force to extend the cable from the dock; and
            rotation of the bottom cover in a retraction direction rotates the rocker arm to disengage the rocker sub gear from the idler gear, wherein the first cable gear axle and the second cable gear axle apply a tension force to the cable.

2. The cable management system of claim 1, wherein:
the dock comprises a peripheral device;
the cable is configured for physical connection of the dock to an information handling system; and
the top cover comprises one or more of a microphone, a speaker, and a plurality of openings corresponding to a plurality of I/O ports.

3. The cable management system of claim 1, wherein:
the first cable gear axle is located on a first side of a cable opening; and
the second cable gear axle is located on a second side of the cable opening, wherein the first cable gear axle is separated from the second cable gear axle by a distance approximately equal to a cross-section dimension of the cable positioned between the first cable gear axle and the second cable gear axle.

4. The cable management system of claim 3, wherein:
the top cover comprises a spiral groove;
the bottom cover comprises a radial slot; and
a slider is coupled to the spiral groove and the radial slot, wherein rotation of the bottom cover in the retraction direction causes radial translation of the slider in a first radial direction; and
rotation of the bottom cover portion in the extension direction causes radial translation of the slider in a second radial direction opposite the first radial direction.

5. The cable management system of claim 4, wherein:
the cable has a length equal to or greater than 0.25 meters; and
the spiral groove and the radial slot are configured to allow multiple windings of the cable.

6. The cable management system of claim 4, wherein:
the cable comprises a plug at a first end, the plug being configured for physical connection of the dock to an information handling system;
rotation of the bottom cover in the retraction direction causes the slider to contact one or more of a first end of the radial slot and a first end of the spiral groove to prevent the plug from retracting inside the cable opening; and
rotation of the bottom cover in the extension direction causes the slider to contact one or more of a second end of the radial slot and a second end of the spiral groove to prevent damage to the cable.

7. The cable management system of claim 6, wherein:
a strain relief maintains the cable at a tangential direction relative to the fixed gear;
one or more of the first end of the spiral groove and the second end of the spiral groove comprises a bump feature; and
slider interaction with the bump feature provides a tactile feedback that the slider is in contact with the first end of the spiral groove or the second end of the spiral groove.

8. The cable management system of claim 1, further comprising:
a plug on a first end of the cable, the plug being configured for physical connection of the dock to an information handling system;
an outer cover comprising:
an outer cover opening; and
a tab, wherein:
the bottom cover comprises a first limiter and a second limiter;
the outer cover is rotatable relative to the top cover and the bottom cover about the central axis;
rotation of the outer cover in the retraction direction when the tab is in contact with the first limiter rotates the bottom cover with the top cover to retract the cable into the dock;
rotation of the outer cover in the retraction direction when the tab is in contact with the first limiter and the plug is positioned in a plug recess area in the dock disengages the outer cover from the bottom cover such that further rotation of the outer cover in the retraction direction positions the outer cover opening offset from the plug recess area;
rotation of the outer cover in the extension direction when the tab is not in contact with the first limiter rotates the outer cover relative to the bottom cover to position the outer cover opening aligned with the plug recess area; and
rotation of the outer cover in the extension direction when the tab is in contact with the first limiter rotates the outer cover and the bottom cover to extend the cable.

9. The cable management system of claim 8, wherein:
the tab comprises magnetic material;
the first limiter comprises ferrous material; and
rotation of the outer cover in the retraction direction when the tab is in contact with the first limiter and the plug is positioned in the plug recess area in the dock comprises overcoming a magnetic force.

10. The cable management system of claim 1, wherein the first cable gear axle and the second cable gear axle comprise a sleeve.

11. A dock comprising:
a top cover comprising a fixed gear defining a central axis;
a bottom cover coupled to the top cover and rotatable about the central axis;
a cable positioned between the top cover and the bottom cover; and
a cable management system comprising:
a rocker assembly rotatably coupled to the bottom cover and offset from the central axis, the rocker assembly comprising:
a rocker drive gear engaged with the fixed gear, the rocker drive gear defining a rocker drive gear axis;
a rocker sub gear engaged with the rocker drive gear; and
a rocker arm coupled to the rocker drive gear and the rocker sub gear and rotatable about the rocker drive gear axis;
an idler gear; and
a pair of cable gears, wherein a first cable gear of the pair of cable gears is engaged with the idler gear, wherein each cable gear is coupled to a cable gear axle in contact with the cable, wherein:
rotation of the bottom cover in an extension direction rotates the rocker arm to engage the rocker sub gear with the idler gear, wherein rotation of the pair of cable gears causes a first cable gear axle and a second cable gear axle to apply an extension force to extend the cable from the dock; and
rotation of the bottom cover in a retraction direction rotates the rocker arm to disengage the rocker sub gear from the idler gear, wherein the first cable gear axle and the second cable gear axle apply a tension force to the cable.

12. The dock of claim 11, wherein:
the dock comprises a peripheral device;
the cable is configured with a plug for physical connection of the dock to an information handling system; and the top cover comprises one or more of a microphone, a speaker, and a plurality of openings corresponding to a plurality of I/O ports.

13. The dock of claim 11, wherein:
the first cable gear axle is located on a first side of a cable opening; and
the second cable gear axle is located on a second side of the cable opening, wherein the first cable gear axle is separated from the second cable gear axle by a distance approximately equal to a cross-section dimension of the cable positioned between the first cable gear axle and the second cable gear axle.

14. The dock of claim 11, wherein:
the top cover comprises a spiral groove;
the bottom cover comprises a radial slot; and
a slider is coupled to the spiral groove and the radial slot, wherein
rotation of the bottom cover in the retraction direction causes radial translation of the slider in a first radial direction; and
rotation of the bottom cover portion in the extension direction causes radial translation of the slider in a second radial direction opposite the first radial direction.

15. The dock of claim 14, wherein:
the cable comprises a plug at a first end, the plug being configured for physical connection of the dock to an information handling system;
a strain relief maintains the cable at a tangential direction relative to the fixed gear;
rotation of the bottom cover in the retraction direction causes the slider to contact one or more of a first end of the radial slot and a first end of the spiral groove to prevent the plug from retracting inside the cable opening; and
rotation of the bottom cover in the extension direction causes the slider to contact one or more of a second end of the radial slot and a second end of the spiral groove to prevent damage to the cable.

16. The dock of claim 15, wherein:
one or more of the first end of the spiral groove and the second end of the spiral groove comprises a bump feature; and
slider interaction with the bump feature provides a tactile feedback that the slider is in contact with the first end of the spiral groove or the second end of the spiral groove.

17. The dock of claim 15, further comprising:
an outer cover comprising:
an outer cover opening; and
a tab, wherein:
the bottom cover comprises a first limiter and a second limiter;
the outer cover is rotatable relative to the top cover and the bottom cover about the central axis;
rotation of the outer cover in the retraction direction when the tab is in contact with the first limiter rotates the bottom cover with the top cover to retract the cable into the dock;
rotation of the outer cover in the retraction direction when the tab is in contact with the first limiter and the plug is positioned in a plug recess area in the dock disengages the outer cover from the bottom cover such that further rotation of the outer cover in the retraction direction positions the outer cover opening offset from the plug recess area;
rotation of the outer cover in the extension direction when the tab is not in contact with the first limiter rotates the outer cover relative to the bottom cover to position the outer cover opening aligned with the plug recess area; and
rotation of the outer cover in the extension direction when the tab is in contact with the first limiter rotates the outer cover and the bottom cover to extend the cable.

18. The dock of claim 17, wherein:
the tab comprises magnetic material;
the first limiter comprises ferrous material; and
rotation of the outer cover in the retraction direction when the tab is in contact with the first limiter and the plug is positioned in a plug recess area into the dock comprises overcoming a magnetic force.

19. The dock of claim 17, wherein:
the cable has a length equal to or greater than 0.25 meters; and
the spiral groove and the radial slot are configured to allow multiple windings of the cable.

20. The dock of claim 11, wherein the first cable gear axle and the second cable gear axle comprise a sleeve.

* * * * *